(12) United States Patent
Yang

(10) Patent No.: US 8,391,024 B2
(45) Date of Patent: Mar. 5, 2013

(54) ELECTRONIC DEVICE WITH CARD CONNECTION MECHANISM

(75) Inventor: Song-Ling Yang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 240 days.

(21) Appl. No.: 12/969,479

(22) Filed: Dec. 15, 2010

(65) Prior Publication Data

US 2012/0127688 A1  May 24, 2012

(30) Foreign Application Priority Data

Nov. 24, 2010  (CN) .......................... 2010 1 0557449

(51) Int. Cl.
*H05K 9/00* (2006.01)

(52) U.S. Cl. .................. 361/818; 361/799; 361/816

(58) Field of Classification Search .................. 361/727, 361/799, 728–730, 752, 816, 818, 796, 737, 361/801–803, 800; 455/575.1–575.4
See application file for complete search history.

(56) References Cited

U.S. PATENT DOCUMENTS

| | | | | |
|---|---|---|---|---|
| 6,563,715 B2 * | 5/2003 | Villain et al. | ................. | 361/800 |
| 7,344,401 B2 * | 3/2008 | Zuo et al. | ....................... | 439/326 |
| 7,420,801 B2 * | 9/2008 | Behl | ........................ | 361/679.33 |
| 7,458,857 B2 * | 12/2008 | Lin et al. | ...................... | 439/630 |
| 7,589,977 B2 * | 9/2009 | Lin | .............................. | 361/816 |
| 7,889,506 B2 * | 2/2011 | Huang | .......................... | 361/737 |

* cited by examiner

*Primary Examiner* — Hung S Bui
(74) *Attorney, Agent, or Firm* — Altis Law Group, Inc.

(57) ABSTRACT

A shield case is configured for supporting a memory card. The shield case includes a recessed portion, and a first edge, a second edge, and a third edge arranged around the recessed portion. The first edge forms a first support plate. The second edge forms a second support plate. The first support plate and the second support plate cooperatively support the memory card.

4 Claims, 4 Drawing Sheets

ELECTRONIC DEVICE WITH CARD CONNECTION MECHANISM

BACKGROUND

1. Technical Field

The present disclosure relates to an electronic device, and particularly to an electronic device with a card connection mechanism.

2. Description of Related Art

Electronic devices such as digital cameras and cellular phones often have the ability to receive a memory card to expand data storage capacity. A memory card connector is mounted on a printed circuit board (PCB) of the electronic device to communicate with the PCB. Although conventional memory card connectors satisfy basic requirements, there is still a need for an improved card connection mechanism.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
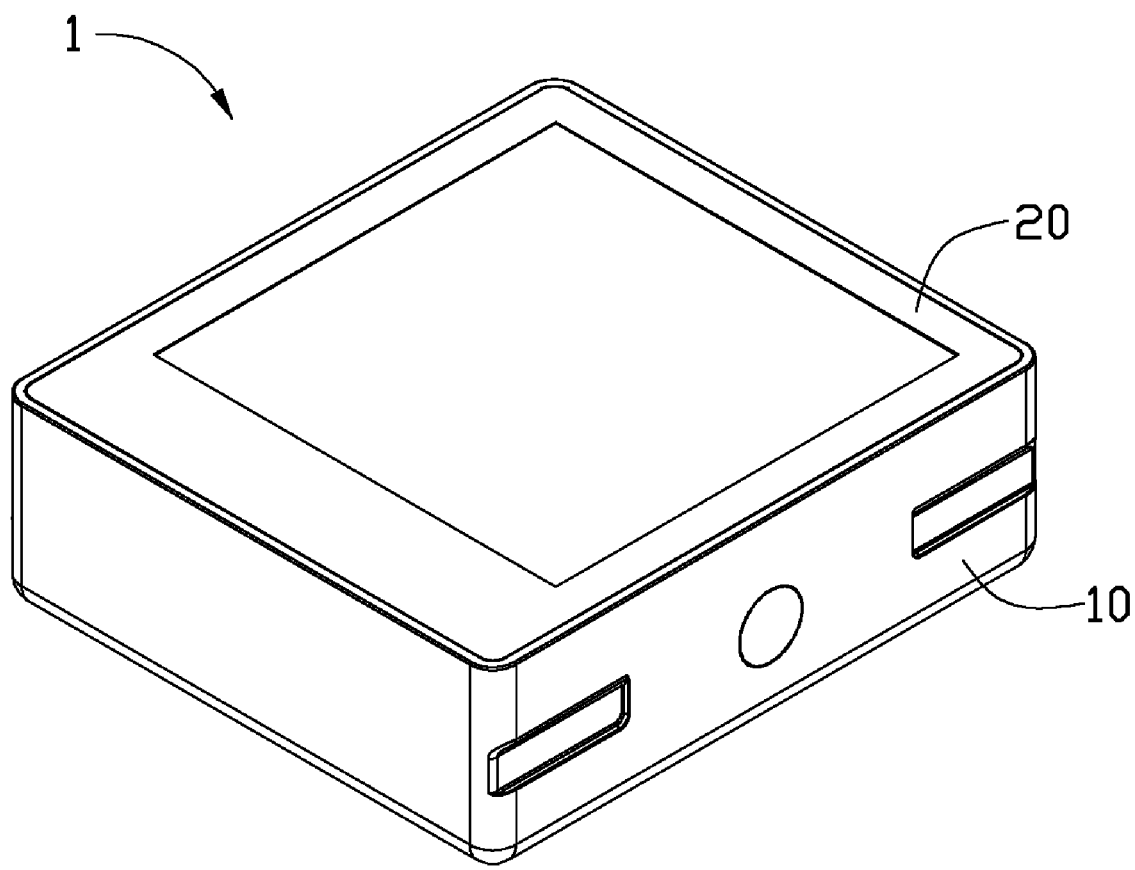
FIG. 1 is an isometric view of an electronic device according to an exemplary embodiment.

Referring to FIG. 1, an electronic device 1 according to an exemplary embodiment is illustrated. The electronic device 1 includes a housing 10 and a cover 20 disposed on the housing 10. In the embodiment, the electronic device 1 is a watch phone.

Figure 2:
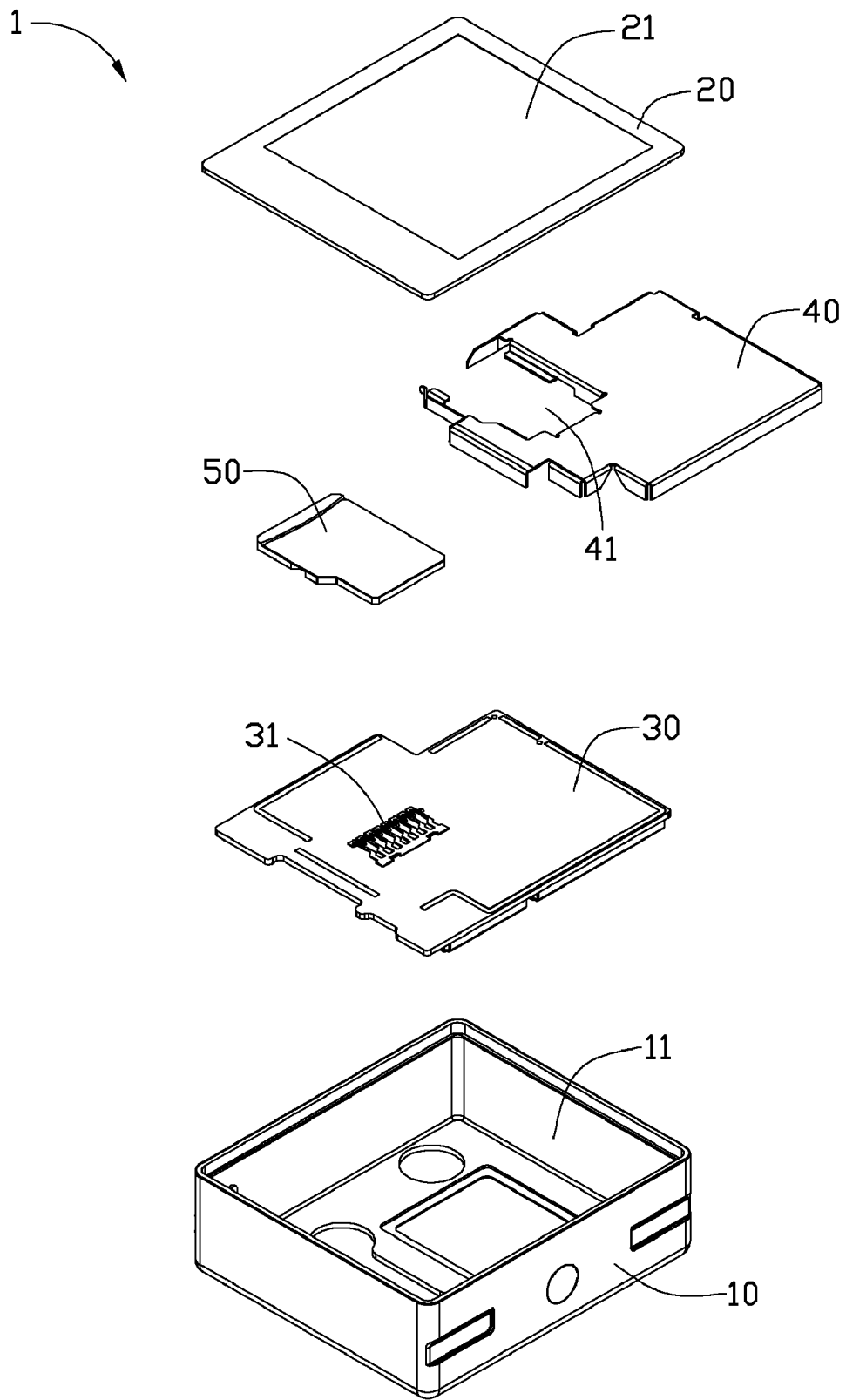
FIG. 2 is an exploded view of the electronic device of FIG. 1.

Referring to FIG. 2, the housing 10 is rectangular and defines a receiving space 11. The cover 20 includes a display 21 opposite to the housing 10. The cover 20 is fixed to the housing 10 and configured for covering the receiving space 11.

The electronic device 1 further includes a printed circuit board 30, a shield case 40, and a memory card 50. The printed circuit board 30 forms a plurality of terminals 31 thereon. The shield case 40 defines a recessed portion 41 facing the terminals 31. The memory card 50 is retained within the recessed portion 41 and electrically connected to the terminals 31. Thus, the memory card 50 is capable of communicating with the printed circuit board 30.

Figure 3:
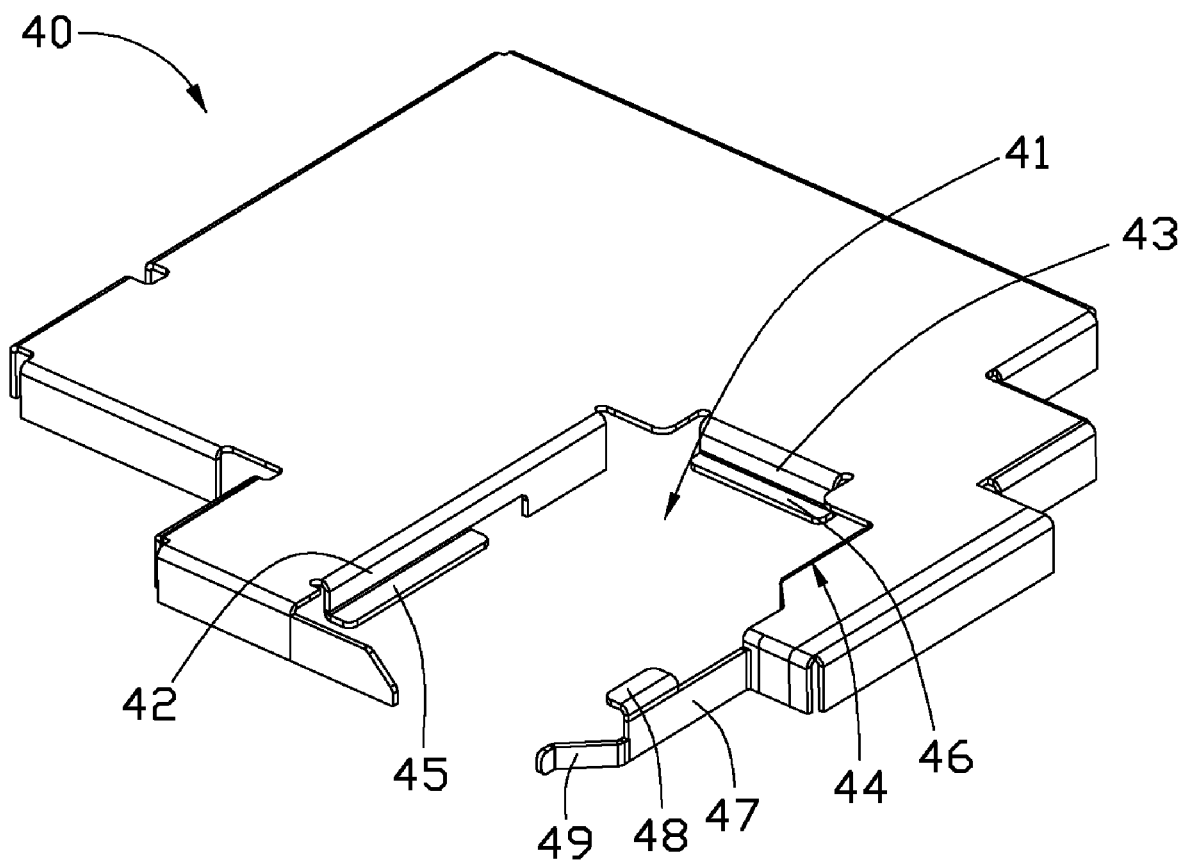
FIG. 3 is an isometric view of a shield case of the electronic device of FIG. 1.

Referring to FIG. 3, the shield case 40 includes a first edge 42, a second edge 43, and a third edge 44 arranged around the recessed portion 41. The first edge 42 is parallel to the third edge 44, and the length of the first edge 42 is greater than that of the third edge 44. The second edge 43 is perpendicular to the first edge 42 and the third edge 44. The first edge 42 forms a first support plate 45 toward the third edge 44, and the second plate 43 forms a second support plate 46 that flushes with the first support plate 45. An elastic arm 47 extends from the second third edge 44 and is parallel to the first edge 42. A distal end of the elastic arm 47 forms a resisting portion 48 and a bent portion 49. The resisting portion 48 is configured for latching the memory card 50.

Figure 4:
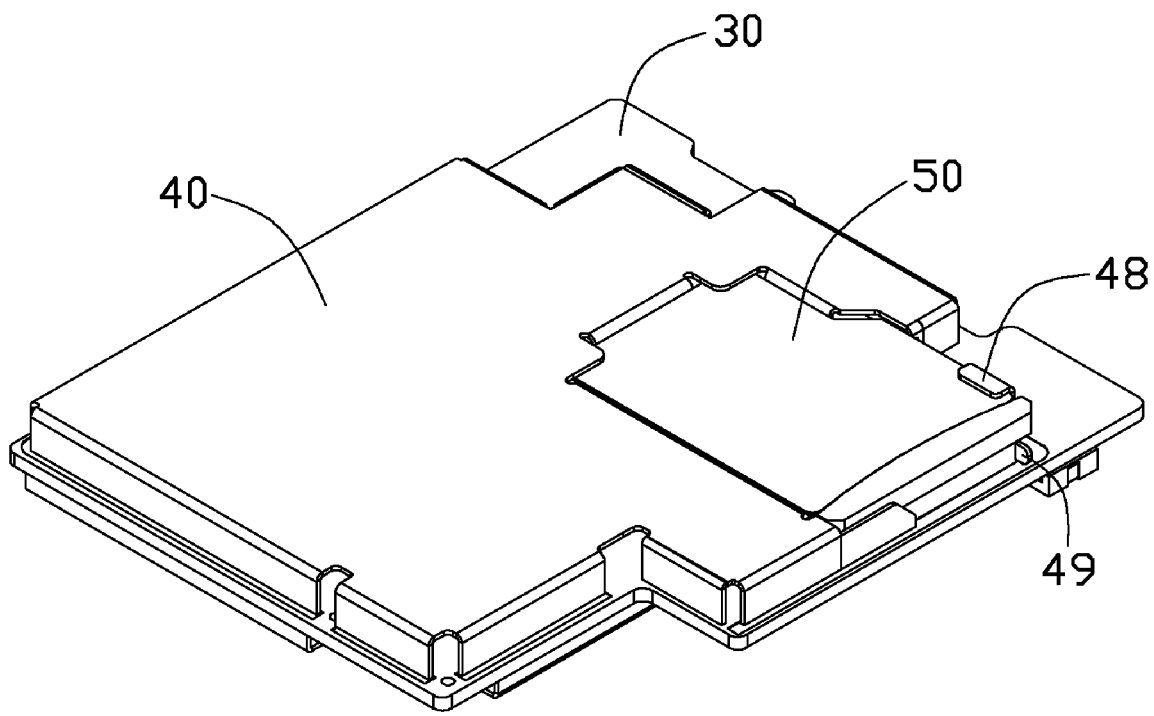
FIG. 4 is an assembled view of a memory card connected to the electronic device of FIG. 1.

Referring to FIG. 4, the shield case 40 is disposed on the printed circuit board 30 for shielding electromagnetic waves. The memory card 50 is retained within the recessed portion 41 and cooperatively supported by the first support plate 45 and the second support plate 46. The resisting portion 48 latches the memory card 50 to the shield case 40. The bent portion 49 is operable to rotate the elastic member 47 around the shield case 40. When the resisting portion 48 is moved away, the memory card 50 can be taken out.

While various embodiments have been described and illustrated, the disclosure is not to be constructed as being limited thereto. Various modifications can be made to the embodiments by those skilled in the art without departing from the true spirit and scope of the disclosure as defined by the appended claims.

What is claimed is:

1. A shield case configured for supporting a memory card, the shield case comprising:
   a recessed portion; and
   a first edge, a second edge, and a third edge arranged around the recessed portion, wherein the first edge forms a first support plate, and the second edge forms a second support plate cooperatively supporting the memory card with the first support plate;
   wherein the third edge comprises an elastic arm in parallel to the first edge, a distal end of the elastic arm forms a resisting portion abutting on and latching the memory card to the shield case.

2. The electronic device as described in claim 1, wherein the elastic arm further comprises a bent portion, the bent portion is operable to spin the elastic member around the shield case that moves away the resisting portion, and thus the memory card is capable of being taken out.

3. An electronic device comprising:
   a housing defining a receiving space;
   a printed circuit board comprising a plurality of terminals thereon;
   a shield case disposed on the printed circuit board for shielding electromagnetic waves, wherein the shield case defines a recessed portion facing toward the terminals; and
   a memory card fixed within the recessed portion and electrically connected to the terminals of the printed circuit board;
   wherein the shield case comprises a first edge, a second edge, and a third edge arranged around the recessed portion, the first edge forms a first support plate, and the second edge forms a second support plate cooperatively supporting the memory card with the first support plate; and
   the third edge comprises an elastic arm in parallel to the first edge, a distal end of the elastic arm forms a resisting portion abutting on and latching the memory card to the shield case.

4. The electronic device as described in claim 3, wherein the elastic arm further comprises a bent portion, the bent portion is operable to spin the elastic member around the shield case that moves away the resisting portion, and thus the memory card is capable of being taken out.

* * * * *